United States Patent
Namiki

(10) Patent No.: US 11,733,308 B2
(45) Date of Patent: Aug. 22, 2023

(54) DETERIORATION STATE ESTIMATION SYSTEM OF SECONDARY BATTERY, DETERIORATION STATE ESTIMATION METHOD OF SECONDARY BATTERY, AND STORAGE MEDIUM

(71) Applicant: HONDA MOTOR CO., LTD., Tokyo (JP)

(72) Inventor: Shigeru Namiki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/678,081

(22) Filed: Feb. 23, 2022

(65) Prior Publication Data
US 2022/0317189 A1 Oct. 6, 2022

(30) Foreign Application Priority Data
Mar. 31, 2021 (JP) ................... 2021-062133

(51) Int. Cl.
*G01R 31/367* (2019.01)
*G01R 31/392* (2019.01)

(52) U.S. Cl.
CPC ......... *G01R 31/367* (2019.01); *G01R 31/392* (2019.01)

(58) Field of Classification Search
CPC ............................ G01R 31/367; G01R 31/392
See application file for complete search history.

(56) References Cited

U.S. PATENT DOCUMENTS

| 11,346,889 B2* | 5/2022 | Arima ................ H01M 10/48 |
| 11,422,192 B2* | 8/2022 | Lee ......................... G06N 3/08 |
| 2009/0001992 A1* | 1/2009 | Tsuchiya ............. G01R 31/367 |
| | | 324/426 |
| 2015/0369875 A1* | 12/2015 | Ishii .................... H01M 10/48 |
| | | 702/63 |
| 2021/0055348 A1* | 2/2021 | Kim .................... G01R 31/367 |
| 2021/0190876 A1* | 6/2021 | Takechi ............ G01R 31/3842 |

FOREIGN PATENT DOCUMENTS

JP 2019-168453 10/2019

* cited by examiner

*Primary Examiner* — Raymond L Nimox
(74) *Attorney, Agent, or Firm* — Amin, Turocy & Watson, LLP

(57) ABSTRACT

A deterioration state estimation system of a secondary battery includes: a state variable measurement unit which measures a state variable including an output current and an output voltage of the secondary battery in operation at each prescribed timing; a preprocessing unit which outputs input data calculated on the basis of the measured state variable; and a deterioration state estimation unit which estimates a deterioration state of the secondary battery in operation through a trained deterioration state model using the input data, wherein the preprocessing unit includes a state variable processing unit which sets a unit amount of charge/discharge and a most recent section closest to a current time and one or more previous sections before the most recent section as a desired section based on the unit amount of charge/discharge used for calculating the input data, calculates, as section data, an amount of voltage change based on the state variable for each set section, includes the calculated section data in the input data, and outputs the input data.

9 Claims, 5 Drawing Sheets

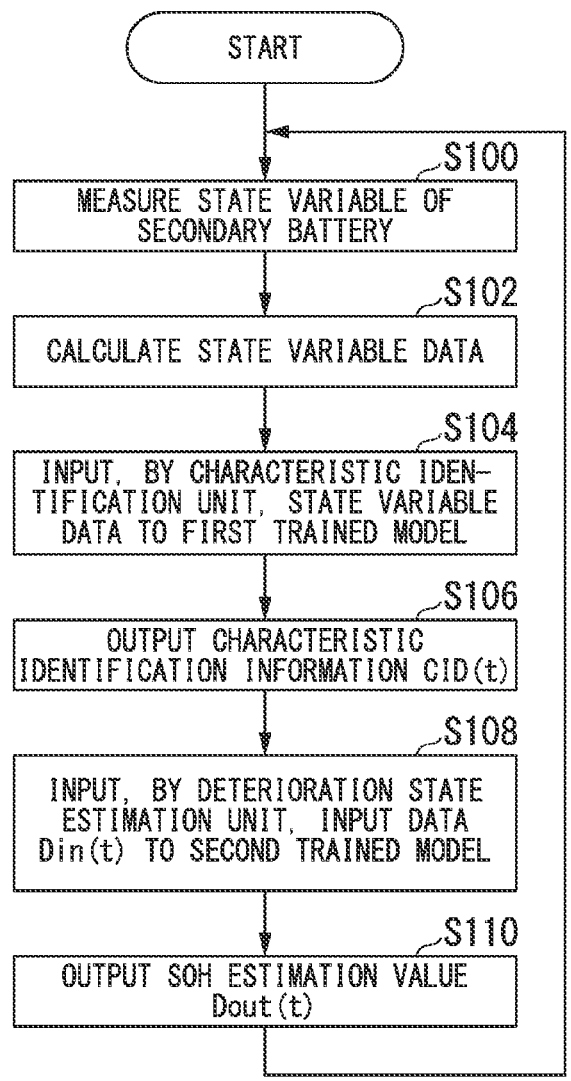

DETERIORATION STATE ESTIMATION SYSTEM OF SECONDARY BATTERY, DETERIORATION STATE ESTIMATION METHOD OF SECONDARY BATTERY, AND STORAGE MEDIUM

CROSS-REFERENCE TO RELATED APPLICATION

Priority is claimed on Japanese Patent Application No. 2021-062133, filed Mar. 31, 2021, the content of which is incorporated herein by reference.

BACKGROUND OF THE INVENTION

Field of the Invention

The present invention relates to a deterioration state estimation system, a deterioration state estimation method, and a storage medium.

Description of Related Art

A technique for training a trained model on the basis of training data having, as output data, a state of health (SOH) at a second time point using, and as input data, time series data associated with a state of charge (SOC) of a storage battery from a first time point to a second time point and an SOH of the storage battery at the first time point is known (for example, refer to Japanese Unexamined Patent Application, First Publication No. 2019-168453).

SUMMARY OF THE INVENTION

When the state of health (SOH) of the secondary battery is estimated through the trained model which has been trained as described above, the state of charge (SOC) is included in the input data. Since the SOC included in the input data is an estimation value, the accuracy of the SOH output through the trained model may decrease in some cases.

An aspect according to the present invention was made in consideration of such circumstances, and an object of the present invention is to provide a deterioration state estimation system, a deterioration state estimation method, and a storage medium capable of improving the accuracy of estimation of the deterioration of a secondary battery through a trained model.

In order to solve the above problems and achieve the above object, the present invention has adopted the following aspects.

(1): A deterioration state estimation system according to an aspect of the present invention includes: a state variable measurement unit which measures a state variable including an output current and an output voltage of the secondary battery in operation at each prescribed timing; a preprocessing unit which outputs input data calculated on the basis of the state variable measured by the state variable measurement unit; and a deterioration state estimation unit which estimates a deterioration state of the secondary battery in operation through a trained deterioration state model using the input data output by the preprocessing unit, wherein the preprocessing unit includes a state variable processing unit which sets a unit amount of charge/discharge and a most recent section closest to a current time and one or more previous sections before the most recent section as a desired section based on the unit amount of charge/discharge used for calculating the input data, calculates an amount of voltage change based on the state variable as section data for each of the set sections, includes the calculated section data in the input data, and outputs the input data.

(2): A deterioration state estimation system according to an aspect of the present invention includes: a state variable measurement unit which measures a state variable including an output current and an output voltage of the secondary battery in operation at each prescribed timing; a preprocessing unit which outputs input data calculated on the basis of the state variable measured by the state variable measurement unit; and a deterioration state estimation unit which estimates a deterioration state of the secondary battery in operation through a trained deterioration state model using the input data output by the preprocessing unit, wherein the preprocessing unit includes a state variable processing unit which sets a large amount of charge/discharge as a unit amount of charge/discharge, a small amount of charge/discharge as a unit amount of charge/discharge smaller than the large amount of charge/discharge, and a most recent large amount section and a most recent small amount section closest to a current time and one or more previous large amount sections and previous small amount sections before the most recent large amount section and the most recent small amount section as a desired section based on the large amount of charge/discharge and the small amount of charge/discharge used for calculating the input data, calculates an amount of voltage change based on the state variable as a large amount section data and a small amount section data for each of the set large amount sections and small amount sections, includes the calculated large amount section data and small amount section data in the input data, and outputs the input data.

(3): In the deterioration state estimation system according to the aspect of the above (1) or (2), the state variable processing unit may set, as the desired section, a period during which an integrated current value obtained by integrating the output current measured by the state variable measurement unit is a prescribed value.

(4): In the deterioration state estimation system according to the aspect of any one of the above (1) to (3), at least one of the calculated amount of charge/discharge for each desired section and the calculated amount of voltage change for each desired section may be a gradient change rate calculated using the least squares method.

(5): In the deterioration state estimation system according to the aspect of any one of the above (1) to (4), a recurrent neural network (RNN) may be constituted as the characteristic identification model.

(6): In the deterioration state estimation system according to the aspect of the above (5), a long/short term memory (LSTM) or a gated recurrent unit (GRU) may be constituted as an intermediate layer of the RNN.

(7): In the deterioration state estimation system according to the aspect of any one of the above (1) to (4), a convolutional neural network (CNN) may be constituted as the characteristic identification model.

(8): A deterioration state estimation method according to an aspect of the present invention causes a computer in a deterioration state estimation system: to measure a state variable including an output current and an output voltage of the secondary battery in operation at each prescribed timing; to output input data calculated on the basis of the measured state variable; to estimate a deterioration state of the secondary battery in operation through a trained deterioration state model using the output input data; and to set a unit amount of charge/discharge used for calculating the input data and a most recent section closest to a current time and one or more previous sections before the most recent section as a desired section based on the unit amount of charge/discharge, calculate an amount of voltage change based on the state variable as section data for each of the set sections, include the calculated section data in the input data, and output the input data.

(9): A computer-readable non-transitory storage medium according to an aspect of the present invention stores a program causing a computer in a deterioration state estimation system: to measure a state variable including an output current and an output voltage of the secondary battery in operation at each prescribed timing; to output input data calculated on the basis of the measured state variable; to estimate a deterioration state of the secondary battery in operation through a trained deterioration state model using the output input data; and to set a unit amount of charge/discharge used for calculating the input data and a most recent section closest to a current time and one or more previous sections before the most recent section as a desired section based on the unit amount of charge/discharge, calculate an amount of voltage change based on the state variable as section data for each of the set sections, include the calculated section data in the input data, and output the input data.

According to (1), (8), and (9), when a deterioration state of the secondary battery is estimated through the trained deterioration state model, section data based on the amount of charge/discharge and the amount of voltage change calculated to correspond to the plurality of desired sections is used. Thus, it is possible to improve the accuracy of deterioration estimation of the secondary battery output through the trained deterioration state model.

According to (2), when a deterioration state of the secondary battery is estimated through the trained deterioration state model, the large amount section data and the small amount section data based on the amount of charge/discharge and the amount of voltage change calculated to correspond to the plurality of large amount sections and small amount sections are used. Thus, it is possible to improve the accuracy of deterioration estimation of the secondary battery output through the trained deterioration state model.

According to (3), it is possible to set a large amount section on the basis of the integrated current value.

According to (4), it is possible to make an amount of charge/discharge and an amount of voltage change as a large amount section data have high accuracy with reduced noise.

According to (5), it is possible to expect the estimation result with high accuracy using an RNN for the deterioration state model.

According to (6), it is possible to expect the estimation result with high accuracy by setting the intermediate layer in the RNN of the deterioration state model to an LSTM.

According to (7), it is possible to expect the estimation result with high accuracy using a CNN for the deterioration state model.

BRIEF DESCRIPTION OF THE DRAWINGS

FIG. 7 is a flowchart for describing an example of a processing procedure performed by a deterioration state estimation device associated with the embodiment in association with estimation of an SOH.

DETAILED DESCRIPTION OF THE INVENTION

Embodiments of a deterioration state estimation system, a deterioration state estimation method, a deterioration state estimation program, and a storage medium of the present invention will be described below with reference to the drawings.

Figure 1:
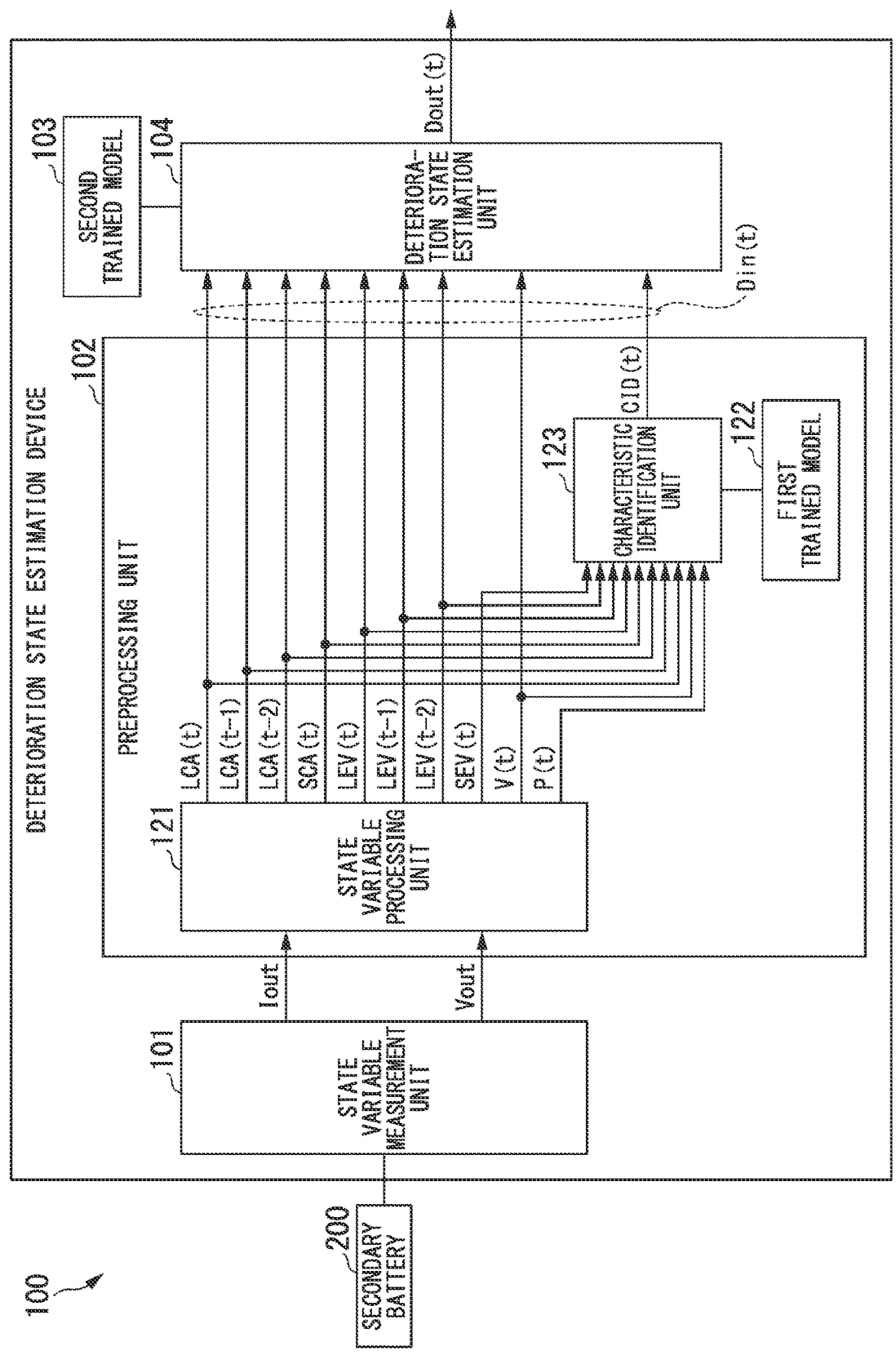
FIG. 1 is a diagram showing an example of a constitution of a deterioration state estimation device associated with an embodiment.

FIG. 1 shows an example of an overall constitution of a deterioration state estimation device 100 associated with an embodiment. The deterioration state estimation device 100 estimates a state of health (SOH) of a secondary battery 200 as a deterioration state of the secondary battery 200. The deterioration state estimation device 100 in FIG. 1 includes a state variable measurement unit 101, a preprocessing unit 102, a second trained model 103 (an example of a deterioration state model), and a deterioration state estimation unit 104.

The state variable measurement unit 101 measures an output current and an output voltage as state variables of the secondary battery 200 in operation and outputs measured output current Iout and output voltage Vout. The output voltage Vout may be calculated on the basis of a closed circuit voltage (CCV) in the secondary battery 200 detected by a sensor. The output voltage Vout may be calculated on the basis of an open circuit voltage (OCV).

The preprocessing unit 102 calculates, as preprocessing, state variable processing data corresponding to a current time t using the output current Iout and the output voltage Vout input from the state variable measurement unit 101. A characteristic identification unit 123 uses state variable data for estimating SOC-OCV characteristics. Data of the state variable processing data other than power data P(t) are output as input data Din(t) corresponding to the current time t. The deterioration state estimation unit 104 uses the input data Din(t) for estimating an SOH.

The preprocessing unit 102 includes a state variable processing unit 121, a first trained model 122 (an example of a characteristic identification model), and the characteristic identification unit 123.

The state variable processing unit 121 receives an input of the output current Iout and the output voltage Vout from the state variable measurement unit 101. The state variable processing unit 121 calculates a large amount section data (amounts of charge/discharge LCA(t) to LCA(t−2) and amounts of voltage change LEV(t) to LEV(t−2)), a small amount section data (an amount of charge/discharge SCA(t)

and an amount of voltage change LEV(t)), voltage data V(t), and power data P(t) which correspond to the current time t on the basis of the input output current Iout and output voltage Vout at each prescribed estimation timing.

The voltage data V(t) may be a CCV. Alternatively, the voltage data V(t) may be an OCV.

The power data P(t) may be discharge power (power consumption) or charge power. Information in which a degree of power consumption, charge power, or the like can be ascertained, for example, information indicating an amount of current, information about a method for using used auxiliary devices and vehicles or the like, may be used instead of the power data P(t). As such power data P(t) or data that is a substitute of the power data P(t), for example, estimated data may be acquired on a cloud or, when the characteristics do not change, unique information may be used.

The section data include a large amount section data and a small amount section data. The large amount section data are a unit large amount of charge/discharge and an amount of voltage change calculated by the state variable processing unit 121 to correspond to each of the plurality of large amount of charge/discharge section which has a constant unit large amount of charge/discharge. The small amount section data are a unit small amount of charge/discharge and an amount of voltage change calculated by the state variable processing unit 121 to correspond to a small amount of charge/discharge section which has a constant unit small amount of charge/discharge.

Hereinafter, the "large amount of charge/discharge section" is also simply referred to as a "large amount section" and the "small amount of charge/discharge section" is also simply referred to as a "small amount section."

Figure 2:
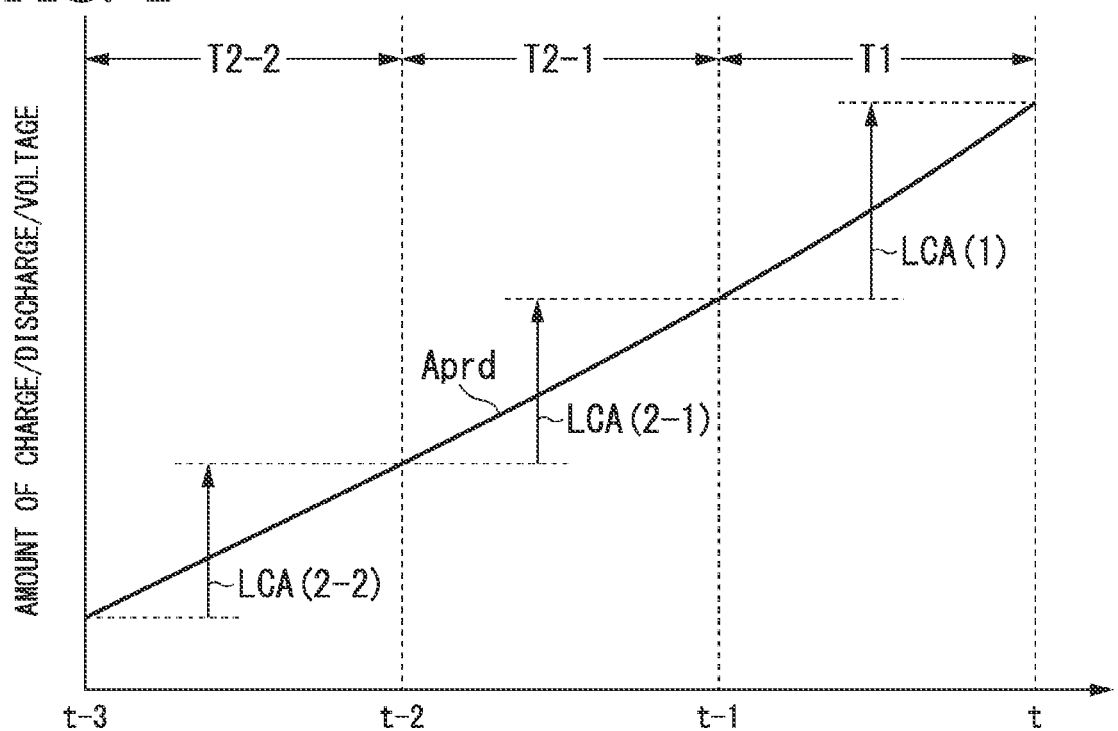
FIG. 2 is a diagram for explaining an example of an aspect of acquisition of a large amount section data associated with the embodiment.

An example of a method for calculating a large amount section data will be described with reference to FIG. 2. FIG. 2 shows a unit amount of charge/discharge Aprd of the secondary battery 200 obtained to correspond to a period from the current time t to a time t−3 previous to the current time t. The unit amount of charge/discharge Aprd shown in FIG. 2 is obtained through integration of the output current Iout.

The state variable processing unit 121 sets a period from a current time t to a time t−1 previous to the current time t, in which a prescribed unit integrated current value (integrated value of the output current Iout) is obtained, as a large amount section (most recent large amount section T1) closest to the current time t. The state variable processing unit 121 sets a period from a time t1 to a time t−1 previous to the time t1, in which a prescribed unit integrated current value is obtained, as a first large amount section (previous large amount section T2-1) before the most recent large amount section T1. The state variable processing unit 121 sets a period from a time t−1 to a time t−2 previous to the time t−1, in which a prescribed unit integrated current value is obtained, as the previous large amount section T2-2 before the previous large amount section T2-1.

In the following description, when the previous large amount sections T2-1 and T2-2 are not particularly distinguished, the previous large amount sections T2-1 and T2-2 may be referred to as a "previous large amount section T2." When the most recent large amount section T1 and the previous large amount section T2 are not particularly distinguished, the most recent large amount section T1 and the previous large amount section T2 may be referred to as a "large amount section T."

As described above, the large amount section T is set as a section in which a predetermined large amount of charge/discharge according to each predetermined integrated current value is obtained. For this reason, a length for each large amount section T may be different. Each large amount section T may be set using a prescribed unit time.

The large amount section T may have a time length of, for example, several tens of seconds to several hundreds of seconds.

The number of previous large amount sections T2 set by the state variable processing unit 121 is not limited to two and may be one or more.

In the example of FIG. 2, three large amount sections T are set to be continuous over time. The three large amount sections T may be made discontinuous by providing a period that is a gap between two large amount sections T which are before and after in a temporal manner. When three or more large amount sections T are set, the three or more large amount sections T may be set to be continuous between two large amount sections which are before and after in a temporal manner and may be set to be discontinuous between two other large amount sections which are before and after in another temporal manner.

The state variable processing unit 121 calculates a large amount section T in which a correspondence is made so that a constant unit large amount of charge/discharge LCA set as described above can be obtained. That is to say, as shown in FIG. 2, the state variable processing unit 121 calculates an actual time of the most recent large amount section T1 in which a correspondence is made so that unit large amount of charge/discharge LCA=amount of charge/discharge LCA(t) is satisfied, calculates an actual time of the previous large amount section T2-1 in which a correspondence is made so that amount of charge/discharge LCA(t−1)=amount of charge/discharge LCA(t) is satisfied, and calculates an actual time of the previous large amount section T2-2 in which a correspondence is made so that amount of charge/discharge LCA(t−2)=amount of charge/discharge LCA(t−1) is satisfied. In other words, the state variable processing unit 121 obtains the previous times (t−1), (t−2), and (t−3) in which unit large amount of charge/discharge LCA=LCA(t)=LCA(t−1)=LCA(t−2) is satisfied and calculates the actual times T1, T2-1, and T2-2. The most recent large amount section may be fixed to T1, that is, a correspondence may be made so that T1=T2-1=T2-2 is satisfied, the amount of charge/discharge LCA(t) may be calculated to correspond to the most recent large amount section T1, the amount of charge/discharge LCA(t−1) may be calculated to correspond to the previous large amount section T2-1, and the amount of charge/discharge LCA(t−2) may be calculated to correspond to the previous large amount section T2-2. However, setting the unit large amount of charge/discharge LCA allows the accuracy of estimation of an SOH which will be described later to be improved.

The state variable processing unit 121 may calculate at least one of the amounts of charge/discharge LCA(t), LCA(t−1), and LCA(t−2) as a gradient change rate using the least squares method. The accuracy of the amount of charge/discharge LCA calculated as a gradient change rate in this way is improved by reducing noise. As a result, it is possible to improve the accuracy of the SOC-OCV characteristics estimated by the first trained model 122 which will be described later and the SOH estimated by the second trained model 103 which will be described later using the amount of charge/discharge LCA.

Figure 3:
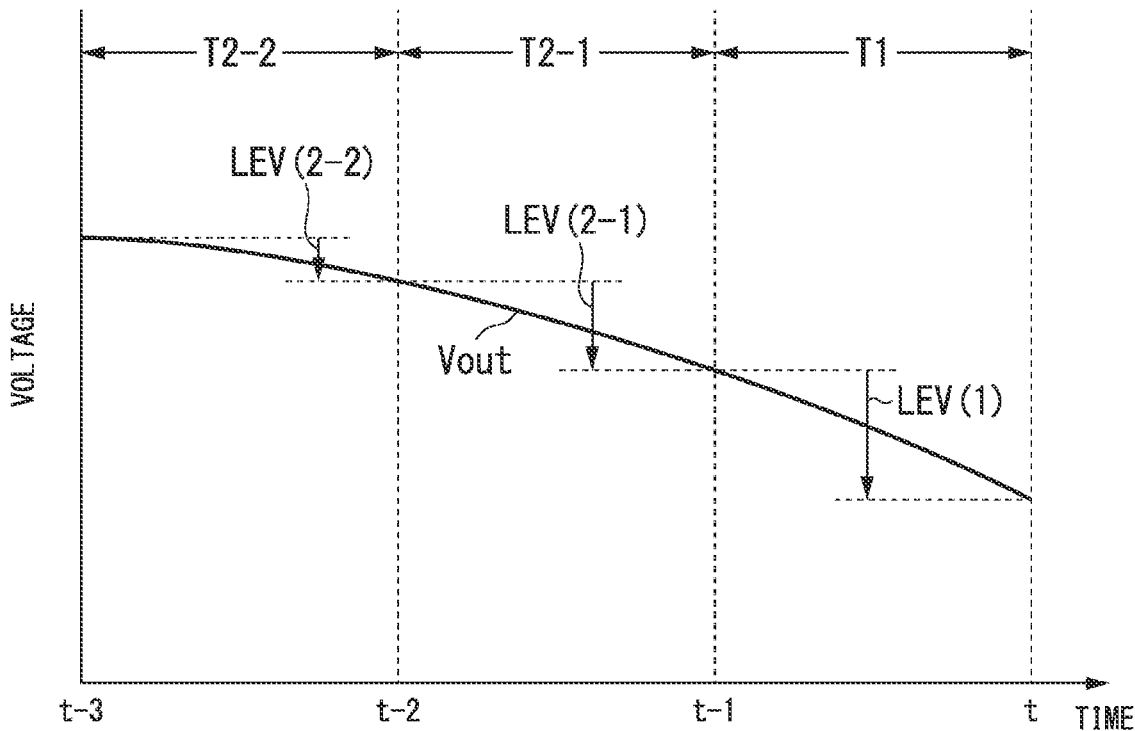
FIG. 3 is a diagram for explaining state of charge (SOC)-open circuit voltage (OCV) characteristics associated with the embodiment.

As shown in FIG. 3, the state variable processing unit 121 calculates an amount of change (amount of voltage change) of a corresponding voltage (output voltage Vout) for each large amount section T calculated as shown in FIG. 2. That is to say, the state variable processing unit 121 calculates the amount of voltage change LEV(t) to correspond to the most recent large amount section T1, calculates the amount of voltage change LEV(t−1) to correspond to the previous large amount section T2-1, and calculates the amount of voltage change LEV(t−2) to correspond to the previous large amount section T2-2.

The state variable processing unit 121 may calculate at least one of the amounts of voltage change LEV(t), LEV(t−1), and LEV(t−2) as a gradient change rate using the least squares method. Also in this case, it is possible to improve the accuracy of the SOC-OCV characteristics estimated by the first trained model 122 which will be described later and the SOH estimated by the second trained model 103 which will be described later using the amount of voltage change LEV.

The state variable processing unit 121 may calculate at least one of the amounts of voltage change LEV(t), LEV(t−1), and LEV(t−2) for a prescribed unit large amount of charge/discharge LCA or the amount of charge/discharge LCA(t) corresponding to a large amount section of a prescribed time length as a gradient change rate using the least squares method. The accuracy of the amount of voltage change LEV(t) calculated as the gradient change rate in this way is improved by reducing noise. As a result, it is possible to improve the accuracy of the SOC-OCV characteristics estimated by the first trained model 122 which will be described later and the SOH estimated by the second trained model 103 which will be described later using the amount of voltage change LEV(t) calculated as the gradient change rate.

In the following description, when the amounts of charge/discharge LCA(t), LCA(t−1), and LCA(t−2) are not particularly distinguished, the amounts of charge/discharge LCA(t), LCA(t−1), and LCA(t−2) are referred to as an "amount of charge/discharge LCA."

In the following description, when the amounts of voltage change LEV(t), LEV(t−1), and LEV(t−2) are not particularly distinguished, the amounts of voltage change LEV(t), LEV(t−1), and LEV(t−2) are referred to as an "amount of voltage change LEV."

When the amount of charge/discharge LCA and the amount of voltage change LEV are not particularly distinguished, the amount of charge/discharge LCA and the amount of voltage change LEV are also referred to as a "large amount section data."

The state variable processing unit 121 may calculate, as a large amount section data, for example, data that is an amount of voltage change per unit large amount of charge/discharge to correspond to the most recent large amount section.

Explanation will continue with reference to FIG. 1 again. The state variable processing unit 121 calculates an actual time of a corresponding small amount section in which the amount of charge/discharge SCA(t) is obtained and an amount of voltage change SEV(t), in addition to an amount of voltage change LEV for each corresponding large amount section T in which a unit large amount of charge/discharge LCA is obtained. In the state variable processing unit 121, for example, previous values corresponding to times t−1 and t−2 may be used for the amount of charge/discharge SCA, the amount of voltage change SEV, and the like.

The state variable processing unit 121 may set as a small amount section, for example, a period based on a time until a prescribed current integration smaller than that corresponding to the large amount section is obtained before the current time t. Alternatively, the state variable processing unit 121 may set, as a small amount section, a period in which a prescribed unit current integration (amount of charge/discharge) of a small amount smaller than that of the large amount section T is performed. The small amount section may be, for example, several seconds to several tens of seconds.

When the amount of charge/discharge SCA(t) and the amount of voltage change SEV(t) are not particularly distinguished, the amount of charge/discharge SCA(t) and the amount of voltage change SEV(t) are referred to as "small amount section data."

As described above, the small amount section is set as a period during which a unit small amount of charge/discharge amount SCA for which each integrated current value is prescribed value can be obtained. For this reason, a length of time for each small amount section may differ.

The number of previous small amount sections set by the state variable processing unit 121 is not limited to one and may be one or more.

In the example of FIG. 1, an amount of power change SEV(t) of one small amount section is input. As in the large amount section T described above, two small amount sections may be set, two small amount sections which are before and after in a temporal manner may be set, and the amount of power change SEV(t) for each set small amount section may be input. The small amount sections may be made discontinuous by providing a period that is a gap between the small amount sections. When three or more small amount sections are set, the three or more small amount sections may be set to be continuous between two small amount sections which are before and after in a temporal manner and may be set to be discontinuous between two small amount sections which are before and after in other temporal manner. Each of the small amount sections may be set using a prescribed unit time.

The state variable processing unit 121 calculates the voltage data V(t) and the power data P(t) corresponding to the current time t. The state variable processing unit 121 may use the output voltage Vout at the current time t as the voltage data V(t). The state variable processing unit 121 may calculate the power data P(t) on the basis of the output current Iout and the output voltage Vout at the current time t.

In the following description, when the large amount section data, the small amount section data, the voltage data V(t), and the power data P(t) which are calculated by the state variable processing unit 121 are not particularly distinguished, the large amount section data, the small amount section data, the voltage data V(t), and the power data P(t) are referred to as "state variable processing data."

The state variable processing unit 121 outputs state variable processing data for each current time t which is updated each time a prescribed time elapses. Therefore, the state variable processing data is time series data obtained at each prescribed time.

The first trained model 122 is a trained model created by inputting state variable processing data and outputting the estimation results of SOC-OCV characteristics through machine learning in which sample data corresponding to the state variable processing data and the SOC-OCV characteristics are used as teacher data. The first trained model 122 may output characteristic identification information which identifies the estimated SOC-OCV characteristics as the estimation results of the SOC-OCV characteristics.

A recurrent neural network (RNN) is constituted as the first trained model 122. Thus, a long/short term memory (LSTM) or a gated recurrent unit (GRU) may be constituted as an intermediate layer of the first trained model 122 as an RNN. Alternatively, a convolutional neural network (CNN) may be constituted as the first trained model 122. The first trained model 122 may treat the estimation of the SOC-OCV characteristics as a regression problem or a classification problem.

In the following description, a case in which an RNN including an LSTM in an intermediate layer is constituted as the first trained model 122 and the estimation of the SOC-OCV characteristics is treated as a regression problem will be provided as an example. In this case, each of the state variable processing data output by the state variable processing unit 121 is input to the first trained model 122 as an LSTM block.

The SOC-OCV characteristics show the correlation between an SOC and an OCV of the secondary battery as a state of the secondary battery.

Figure 4:
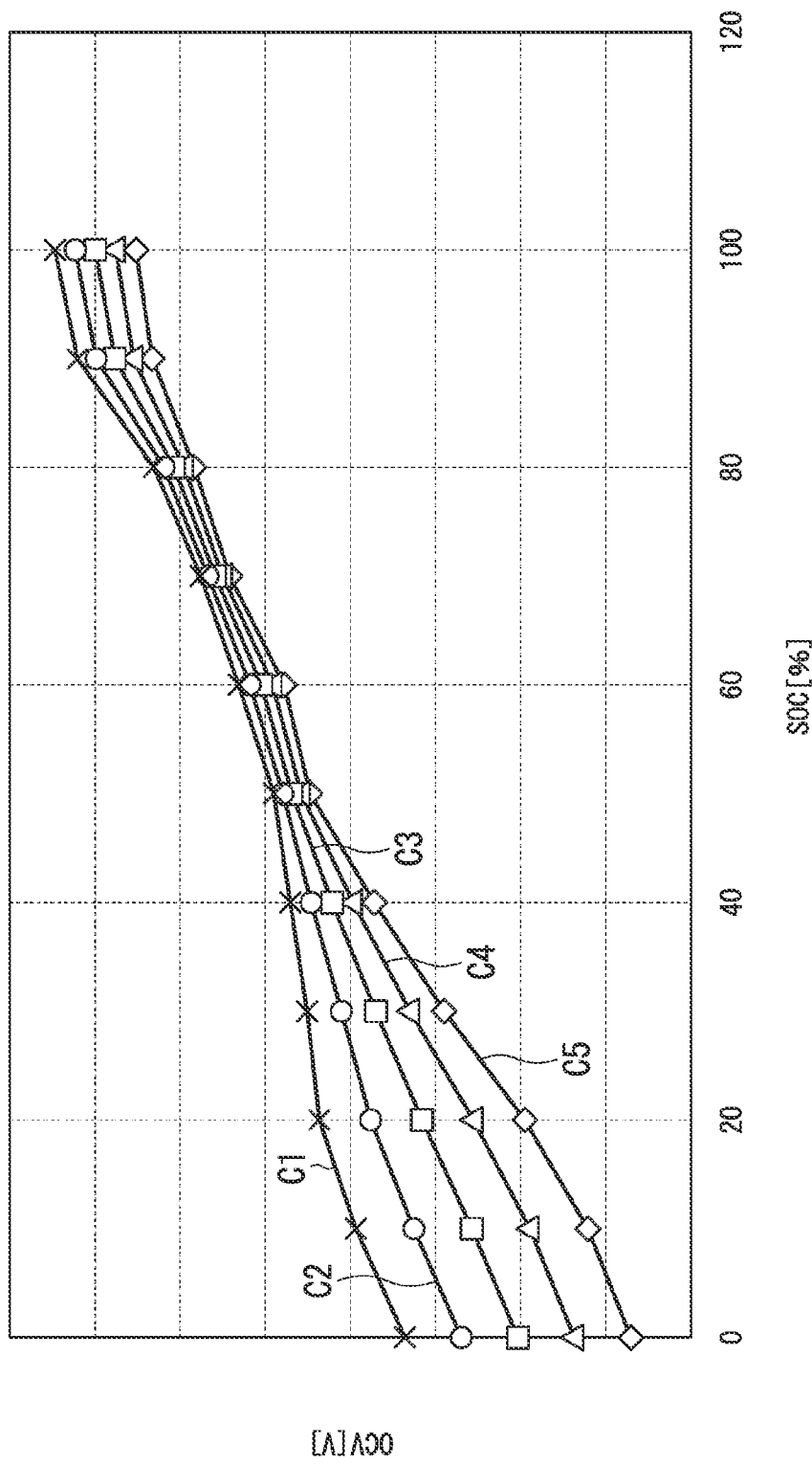
FIG. 4 is a diagram for explaining identification of a state of health (SOH) according to a relationship between an amount of charge/discharge and an amount of voltage change associated with the embodiment.

FIG. 4 shows a specific example of the SOC-OCV characteristics. In FIG. 4, the horizontal axis indicates an SOC and the vertical axis indicates an OCV. In FIG. 4, curves C1 to C5 corresponding to five different SOC-OCVs are shown. For example, such a plurality of SOC-OCV characteristics may be provided as estimation candidates corresponding to the first trained model 122 and characteristic identification information may be provided to each of the SOC-OCV characteristics provided as the estimation candidates.

In the example of FIG. 4, a value of an OCV of the curve C1 for the same SOC is the highest and then values of the OCV decrease in an order of the curves C2, C3, C4, and C5. As a relative relationship, for example, when two SOC-OCV characteristics corresponding to the curves C1 and C2 are compared, the SOC-OCV characteristics corresponding to the curve C1 have high characteristics and the SOC-OCV characteristics corresponding to the curve C2 have low characteristics.

The characteristic identification unit 123 causes the state variable processing data corresponding to the current time t to be input to the first trained model 122. The characteristic identification unit 123 acquires characteristic identification information output by the first trained model 122 in accordance with an input of the state variable processing data. The characteristic identification unit 123 outputs the acquired characteristic identification information as characteristic identification information CID(t) corresponding to the current time t.

The second trained model 103 is a model trained through machine learning in which sample data corresponding to the input data Din(t) and the characteristic identification information CID(t)) and an SOH are used as teacher data. The second trained model 103 outputs an SOH in accordance with the input data Din(t) input using the deterioration state estimation unit 104.

The input data Din(t) includes the large amount section data (amounts of charge/discharge LCA(t), LCA(t−1), and LCA(t−2) and amounts of voltage change LEV(t), LEV(t−1), and LEV(t−2)), the small amount section data (amount of charge/discharge SAC(t) and amount of voltage change SEV(t)), the voltage data V(t), and the characteristic identification information CID(t).

The input data Din(t) may further include the power data P(t).

An RNN is constituted as the second trained model 103. Thus, an LSTM or a GRU may be constituted as an intermediate layer of the second trained model 103 as an RNN. Alternatively, a CNN may be constituted as the second trained model 103. The second trained model 103 may treat the estimation of an SOH as a regression problem or a classification problem.

In the following description, a case in which an RNN including an LSTM in the intermediate layer is constituted as the second trained model 103 and a case in which the estimation of an SOH is treated as a classification problem will be provided as an example. In this case, each of the state variable processing data output by the state variable processing unit 121 is input to the second trained model 103 as an LSTM block.

The deterioration state estimation unit 104 causes the input data Din(t) corresponding to the current time t to be input to the second trained model 103. The deterioration state estimation unit 104 acquires a value of an SOH output by the second trained model 103 in accordance with an input of the input data Din(t). The deterioration state estimation unit 104 outputs the acquired value of the SOH as an SOH estimation value Dout.

Figure 5:
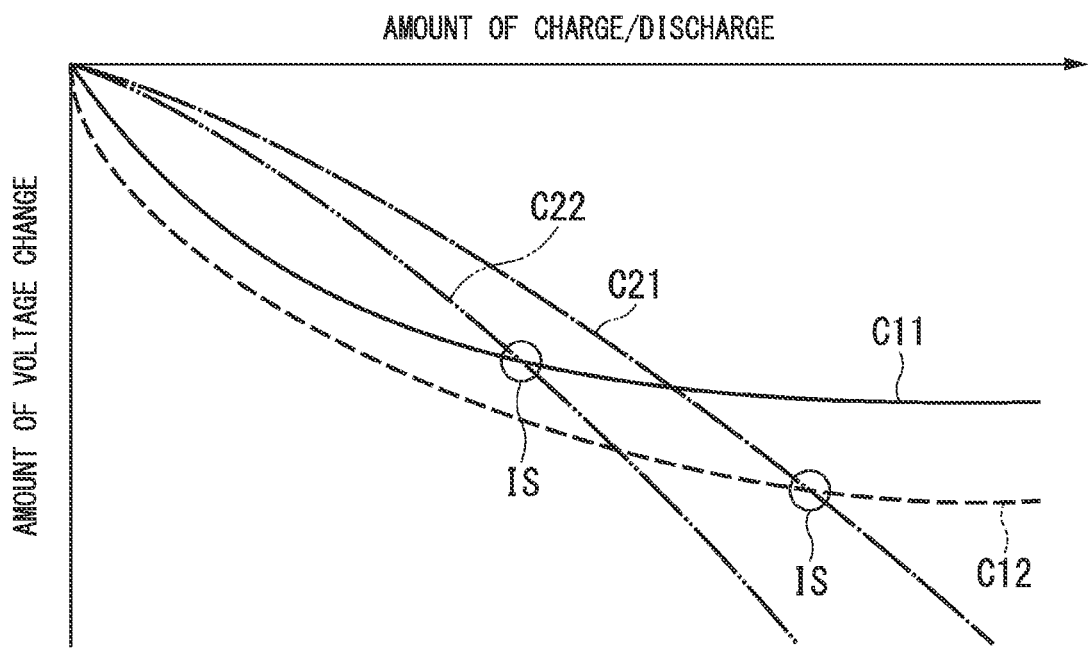
FIG. 5 is a diagram for explaining identification of an SOH according to a relationship between an amount of charge/discharge and an amount of voltage change associated with the embodiment.

FIG. 5 shows an example of a relationship between an amount of charge/discharge and an amount of voltage change. FIG. 5 shows four curves C11, C12, C21, and C22 corresponding to different SOH estimation values. FIG. 5 shows a case in which the curve C11 and the curve C21 have the same capacity α (Ah) of the secondary battery and the curve C12 and the curve C22 have the same capacity β (Ah) smaller than α (Ah) of the secondary battery.

Since the SOH estimation value also corresponds to, for example, certain specific SOC-OCV characteristics, these four curves C11, C12, C21, and C22 also correspond to specific SOC-OCV characteristics. As a relative relationship, a classification in which the SOC-OCV characteristics corresponding to the curves C11 and C12 have high characteristics and the SOC-OCV characteristics corresponding to the curves C21 and C22 have low characteristics can be performed.

In the example of FIG. 5, as shown as an intersection IS, there are points in which the curve corresponding to the SOC-OCV characteristics having high characteristics intersects the curve corresponding to the SOC-OCV characteristics having lower characteristics.

Figure 6:
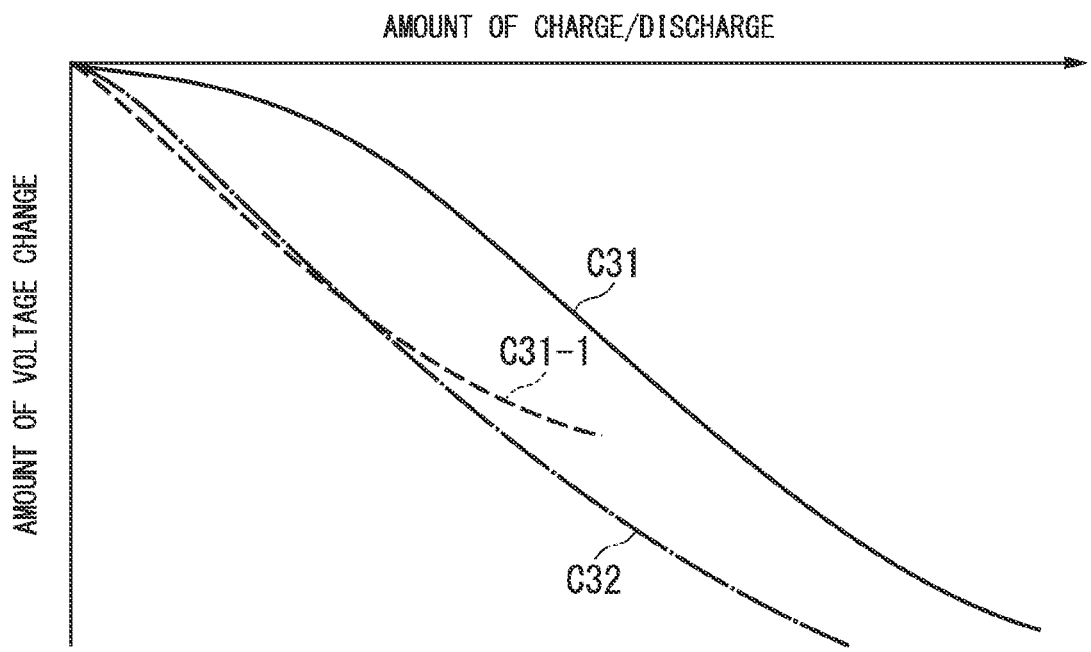
FIG. 6 is a diagram for explaining identification of an SOH according to a relationship between an amount of charge/discharge and an amount of voltage change associated with the embodiment.

FIG. 6 shows three curves C31, C32, and C31-1 showing a relationship between an amount of charge/discharge and an amount of voltage change. In FIG. 6, the curves C31 and C32 correspond to different SOHs and are curves obtained when a corresponding secondary battery is started to operate from a state of 100% SOC. Meanwhile, although the curve C31-1 corresponds to the same SOH as that corresponding to the curve C31, the curve C31-1 is a curve when the secondary battery is started to operate from a state of 50% SOC. Although the curve C31 and the curve C32 do not overlap in the example of FIG. 6, in the case of the curve C31-1 corresponding to the same SOC-OCV characteristics as the curve C31 but having a different SOC at the time of starting an operation, the curve C31-1 and the curve C32 overlap. That is to say, sections in which a plurality of curves overlap due to the SOC at the time of starting an operation may occur in some cases.

Curves corresponding to different SOHs may overlap or intersect due to variations or the like in state variables measured by the state variable measurement unit 101.

A plurality of amounts of charge/discharge LCA(t), LCA(t−1), and LCA(t−2) and three amounts of voltage change LEV(t), LEV(t−1), and LEV(t−2) which correspond to each of a plurality of (three) different large amount sections (T1, T2-1, and T2-2) are input to the input data Din(t) input to the second trained model 103 by the deterioration state estimation unit 104 in the embodiment. That is to say, a long-term history as a large amount section data for the amount of charge/discharge and the amount of voltage change is input to the second trained model 103 as input characteristic quantities, in addition to a short-term history (Lookback) as a small amount section data.

For this reason, even if the curves overlap or intersect between the SOH estimation values that are the estimation candidates as described above, the second trained model 103 performs an estimation using the amount of charge/discharge and the amount of voltage change corresponding to a plurality of temporally different large amount sections. Thus, it becomes possible to distinguish an SOH by distinguishing a plurality of curves which overlap or intersect. In this case, the second trained model 103 can be expected to increase a training range for previous information by increasing input parameters between histories in one LSTM and increasing the number of input parameters for the histories. As a result, it is possible to improve the accuracy of the SOH estimation value Dout(t) output by the second trained model 103.

As included in the input data Din(t), the state variable processing data input to the first trained model 122 by the characteristic identification unit 123 also includes a plurality of large amounts section data corresponding to the amount of charge/discharge and a plurality of large amounts section data corresponding to the amount of voltage change.

When such large amounts section data are input, the first trained model 122 can also perform an estimation using the amount of charge/discharge and the amount of voltage change corresponding to a plurality of temporally different large amount sections. Thus, for example, as illustrated in FIG. 5, even when the curves corresponding to the SOC-OCV characteristics having high characteristics and low characteristics intersect, it is possible to refer to the section of the curve in a long term instead of instantaneously. Thus, it is possible to prevent erroneous determination by appropriately discriminating the SOC-OCV characteristics having high characteristics and low characteristics. Therefore, it is possible to improve the accuracy of the SOC-OCV characteristics estimated by the first trained model 122.

The input data Din(t) input to the second trained model 103 by the deterioration state estimation unit 104 includes characteristic identification information CID about the SOC-OCV characteristics estimated using the first trained model 122 as described above. That is to say, the input data Din(t) includes information about the SOC-OCV characteristics.

When the second trained model 103 performs an estimation using the input data Din(t) including such information about the SOC-OCV characteristics, using an SOC estimation value and an internal resistance estimation value is no longer required. When the SOC estimation value and the internal resistance estimation value are not used, in the embodiment, the second trained model 103 can estimate an SOH without being affected by an error of the SOC estimation value, by which it is possible to improve the accuracy.

The characteristic identification information CID included in the input data Din(t) for estimating the SOH is not fixedly set to correspond to the secondary battery 200 that is a target. That is to say, the characteristic identification information CID corresponds to the result estimated by the first trained model 122 using the state variable processing data based on the state variable measured for the secondary battery 200 that is a target. For this reason, in the embodiment, it is possible to estimate the characteristic identification information CID correspond to the corresponding secondary battery 200 with an accuracy of a certain level or higher, regardless of changes in the specifications or the like of the secondary battery 200. Therefore, the deterioration state estimation device 100 in the embodiment can appropriately estimate an SOH to correspond to various the secondary batteries 200.

The second trained model 103 in the embodiment may estimate an SOH using the input data Din(t) which does not include the characteristic identification information CID, for example, when the conditions such as certain accuracy can be satisfied.

An example of a processing procedure performed by the deterioration state estimation device 100 in association with an SOH estimation will be described with reference to the flowchart of FIG. 7. The processing of FIG. 7 is started every time a predetermined time elapses.

The state variable measurement unit 101 measures state variables of the secondary battery 200 (Step S100). The state variables of the secondary battery 200 are an output current Iout and an output voltage Vout corresponding to a current time t.

In the preprocessing unit 102, the state variable processing unit 121 calculates state variable processing data corresponding to the current time t using the output current Iout and the output voltage Vout measured in Step S100 (Step S102).

The state variable processing data includes the large amount section data, the small amount section data, the voltage data V(t), and the power data P(t). The large amount section data are the amounts of charge/discharge LCA(t), LCA(t−1), and LCA(t−2) and the amounts of voltage change LEV(t), LEV(t−1), and LEV(t−2). The small amount section data are the amount of charge/discharge SCA(t) and the amount of voltage change SEV(t).

The characteristic identification unit 123 causes the state variable data calculated in Step S102 to be input to the first trained model 122 (Step S104).

The first trained model 122 outputs characteristic identification information as the estimation result of the SOC-OCV characteristics in accordance with the state variable data input in Step S104. The characteristic identification unit 123 acquires the characteristic identification information output by the first trained model 122 and outputs the acquired characteristic identification information as the characteristic identification information CID(t) corresponding to the current time t (Step S106).

The deterioration state estimation unit 104 causes the input data Din(t) to be input to the second trained model 103 (Step S108).

The second trained model 103 estimates an SOH in accordance with the input data Din(t) input in Step S108. The deterioration state estimation unit 104 outputs the SOH estimated by the second trained model 103 as the SOH estimation value Dout(t) corresponding to the current time t (Step S110).

The use of the secondary battery 200 in the embodiment is not particularly limited. The secondary battery 200 may be provided in a vehicle, for example, for driving the vehicle. The secondary battery 200 may be provided in a house, a company building, or the like. The secondary battery 200 may be provided in a power transmission network such as a smart grid.

The functions as the deterioration state estimation device 100 in the embodiment may be constituted as a deterioration state estimation system in which the functions of the deterioration state estimation device 100 in the embodiment are distributed to a plurality of devices. As an example, such a deterioration state estimation system may include a terminal device including a secondary battery that is a deterioration estimation target and a cloud server connected to the terminal device in a communicable manner. The terminal device may transmit a state variable of a secondary battery measured using the functions as the state variable measurement unit 101 to the cloud server and the cloud server may output an SOH estimation value through the functions as the preprocessing unit 102, the second trained model 103, and the deterioration state estimation unit 104 using the received state variable.

The processing as the deterioration state estimation device 100 described above may be performed by recording a program for realizing the functions of the deterioration state estimation device 100 described above on a computer-readable recording medium, reading the program recorded on the recording medium into a computer system, and executing the program. Here, the expression "reading the program recorded on the recording medium into a computer system, and executing the program" includes installing the program in the computer system. The "computer system" mentioned herein includes an operating system (OS) and hardware such as peripheral devices. The "computer system" may include a plurality of computer devices connected over a network including a communication line such as the Internet, a wide area network (WAN), a local area network (LAN), and a dedicated line. The "computer-readable recording medium" refers to a portable medium such as a flexible disk, a magneto-optical disk, a read only memory (ROM), and a compact-disc (CD)-ROM, and a storage device such as a hard disk built in the computer system. As described above, the recording medium having the program stored therein may be a non-transitory recording medium such as a CD-ROM. The recording medium also includes an internal or external recording medium accessible from a distribution server for distributing the program. Codes of the program stored in the recording medium of the distribution server may be different from codes of the program in a format in which the codes can be executed by the terminal device. That is to say, any format stored in the distribution server may be adopted as long as the format is a format in which the codes can be downloaded from the distribution server and can be installed in a form in which the codes can be executed by the terminal device. A constitution in which the program is be divided into a plurality of parts, each of the plurality of parts is downloaded at different timings, and then the plurality of parts are combined in the terminal device may be provided or different distribution servers which distribute divided programs may be provided. Furthermore, the "computer-readable recording medium" also includes a medium which holds the program for a certain period of time such as a volatile memory (random-access memory (RAM)) inside the computer system which serves as a server or a client when the program is sent over a network. The program described above may be for realizing a part of the functions described above. Furthermore, the program may be a so-called difference file (difference program) which can realize the functions described above in combination with the program recorded in the computer system in advance.

Although the aspects for carrying out the present invention have been described above using the embodiments, the present invention is not limited to these embodiments and various modifications and substitutions are possible without departing from the gist of the present invention.

What is claimed is:

1. A deterioration state estimation system of a secondary battery, comprising one or more processors functioning as:
a state variable measurement unit which measures a state variable including an output current and an output voltage of the secondary battery in operation at each of prescribed timings;
a preprocessing unit which outputs input data calculated on the basis of the state variable measured by the state variable measurement unit; and
a deterioration state estimation unit which estimates a deterioration state of the secondary battery in operation through a trained deterioration state model using the input data output by the preprocessing unit,
wherein the preprocessing unit includes a state variable processing unit which sets a unit amount of charge/discharge and a most recent section closest to a current time and one or more previous sections before the most recent section as a desired section based on the unit amount of charge/discharge used for calculating the input data, calculates an amount of voltage change based on the state variable as section data for each of the set sections, includes the calculated section data in the input data, and outputs the input data.

2. A deterioration state estimation system of a secondary battery, comprising one or more processors functioning as:
a state variable measurement unit which measures a state variable including an output current and an output voltage of the secondary battery in operation at each prescribed timing;
a preprocessing unit which outputs input data calculated on the basis of the state variable measured by the state variable measurement unit; and
a deterioration state estimation unit which estimates a deterioration state of the secondary battery in operation through a trained deterioration state model using the input data output by the preprocessing unit,
wherein the preprocessing unit includes a state variable processing unit which sets a large amount of charge/discharge as a unit amount of charge/discharge, a small amount of charge/discharge as a unit amount of charge/discharge smaller than the large amount of charge/discharge, and a most recent large amount section and a most recent small amount section closest to a current time and one or more previous large amount sections and previous small amount sections before the most recent large amount section and the most recent small amount section as a desired section based on the large amount of charge/discharge and the small amount of charge/discharge used for calculating the input data, calculates an amount of voltage change based on the state variable as a large amount section data and a small amount section data for each of the set large amount sections and small amount sections, includes the calculated large amount section data and small amount section data in the input data, and outputs the input data.

3. The deterioration state estimation system according to claim 1, wherein the state variable processing unit sets, as the desired section, a period during which an integrated current value obtained by integrating the output current measured by the state variable measurement unit is a prescribed value.

4. The deterioration state estimation system according to claim 1, wherein at least one of the calculated amount of charge/discharge for each desired section and the calculated amount of voltage change for each desired section is a gradient change rate calculated using the least squares method.

5. The deterioration state estimation system according to claim 1, wherein a recurrent neural network (RNN) is constituted as the characteristics identification model.

6. The deterioration state estimation system according to claim 5, wherein a long/short term memory (LSTM) or a gated recurrent unit (GRU) is constituted as an intermediate layer of the RNN.

7. The deterioration state estimation system according to claim 1, wherein a convolutional neural network (CNN) is constituted as the characteristics identification model.

8. A deterioration state estimation method of a secondary battery causing a computer in a deterioration state estimation system:
to measure a state variable including an output current and an output voltage of the secondary battery in operation at each prescribed timing;
to output input data calculated on the basis of the measured state variable;
to estimate a deterioration state of the secondary battery in operation through a trained deterioration state model using the output input data; and
to set a unit amount of charge/discharge used for calculating the input data and a most recent section closest to a current time and one or more previous sections before the most recent section as a desired section based on the unit amount of charge/discharge, calculate an amount of voltage change based on the state variable as section data for each of the set sections, include the calculated section data in the input data, and output the input data.

9. A computer-readable non-transitory storage medium storing a program causing a computer in a deterioration state estimation system:
to measure a state variable including an output current and an output voltage of the secondary battery in operation at each prescribed timing;
to output input data calculated on the basis of the measured state variable;
to estimate a deterioration state of the secondary battery in operation through a trained deterioration state model using the output input data; and
to set a unit amount of charge/discharge used for calculating the input data and a most recent section closest to a current time and one or more previous sections before the most recent section as a desired section based on the unit amount of charge/discharge, calculate an amount of voltage change based on the state variable as section data for each of the set sections, include the calculated section data in the input data, and output the input data.

* * * * *